United States Patent [19]

Dekker et al.

[11] Patent Number: 5,405,789

[45] Date of Patent: Apr. 11, 1995

[54] METHOD OF MANUFACTURING A SEMICONDUCTOR DEVICE WHEREBY A LATERALLY BOUNDED SEMICONDUCTOR ZONE IS FORMED IN A SEMICONDUCTOR BODY IN A SELF-ALIGNING MANNER

[75] Inventors: Ronald Dekker; Henricus G. R. Maas; Armand Pruijmboom; Wilhelmus T. A. J. Van Den Einden, all of Eindhoven, Netherlands

[73] Assignee: U.S. Philips Corporation, New York, N.Y.

[21] Appl. No.: 141,888

[22] Filed: Oct. 22, 1993

[30] Foreign Application Priority Data

Oct. 23, 1992 [EP] European Pat. Off. ........... 92203255

[51] Int. Cl.⁶ .......................................... H01L 21/265
[52] U.S. Cl. ...................................... 437/31; 437/162; 437/192
[58] Field of Search .............. 437/31, 162, 65, 66, 437/67, 190, 192, 194; 148/DIG. 105, DIG. 106

[56] References Cited

U.S. PATENT DOCUMENTS

| | | | |
|---|---|---|---|
| 4,889,828 | 12/1989 | Jeuch | 148/DIG. 105 |
| 5,006,476 | 4/1991 | De Jong et al. | 437/31 |
| 5,128,271 | 7/1992 | Bronner et al. | 437/67 |

Primary Examiner—Brian E. Hearn
Assistant Examiner—Tuan Nguyen
Attorney, Agent, or Firm—Steven R. Biren

[57] ABSTRACT

A method of manufacturing a semiconductor device with a semiconductor element which includes a semiconductor zone (19) situated below an electrode (18) and adjoining a surface (5) of a semiconductor body (1), which semiconductor zone substantially does not project outside the electrode (18) in lateral direction. The electrode (18) is here formed on the surface (5) of the semiconductor body (1), after which semiconductor material adjoining the surface (5) and not covered by the electrode (18) is removed by an etching treatment, whereby the position of the semiconductor zone (19) below the electrode (18) is defined. Before the electrode (18) is formed, a surface zone (16) adjoining the surface (5) is formed in the semiconductor body (1) with a depth and a doping such as are desired for the semiconductor zone (19) to be formed below the electrode (18), after which the electrode (18) is formed on this surface zone and, during the etching treatment, the portion of the surface zone (16) not covered by the electrode (18) is etched away through its entire thickness. Conducting materials such as aluminium or aluminium alloys may be used for the electrode (18), i.e. materials which are not resistant to temperatures necessary for forming semiconductor zones through diffusion.

5 Claims, 11 Drawing Sheets

METHOD OF MANUFACTURING A SEMICONDUCTOR DEVICE WHEREBY A LATERALLY BOUNDED SEMICONDUCTOR ZONE IS FORMED IN A SEMICONDUCTOR BODY IN A SELF-ALIGNING MANNER

BACKGROUND OF THE INVENTION

The invention relates to a method of manufacturing a semiconductor device with a semiconductor element which comprises a semiconductor zone which is situated below an electrode, adjoins a surface of a semiconductor body, and substantially does not extend laterally outside the electrode, in which method an electrode is formed on the surface of the semiconductor body, after which semiconductor material adjoining the surface and not covered by the electrode is removed by an etching treatment, whereby the position of the semiconductor zone below the electrode is defined.

During the etching treatment by which the position of the semiconductor zone relative to the electrode is defined, the electrode itself is used as a mask. The semiconductor zone is thus laterally bounded in a self-aligning manner during its formation in the semiconductor body.

U.S. Pat. No. 5,006,476 discloses a method of the kind mentioned in the opening paragraph whereby the electrode is formed in a doped layer of amorphous silicon deposited on the surface. The etching treatment which is subsequently carried out and by which the position of the semiconductor zone is defined is continued so long until the semiconductor material situated adjacent the electrode is removed through a depth which is substantially equal to that of the semiconductor zone to be formed. After the etching treatment has been carried out, the semiconductor body is heated to a temperature at which dopant diffuses from the electrode present at the surface into the semiconductor material. This treatment is continued until the semiconductor zone has reached the desired depth.

The known method forms not only the electrode in the layer of polycrystalline silicon, but also a pattern of conductors of which the electrode forms part. These conductors are provided with a top layer of a metal silicide so as to ensure that connections formed by the pattern of conductors have a comparatively low electrical resistance. This is achieved in that the conductors, after they have been formed, are provided with a layer of insulating material at their lateral faces, in that subsequently a metal layer is deposited over the entire assembly, and in that subsequently a heat treatment is carried out whereby the metal silicide is formed through reaction of the metal with the amorphous silicon. Since the metal layer does not react with the layer of insulating material on the lateral faces of the conductors, the latter are provided with metal silicide layers at their upper sides only. This takes place in a self-aligning manner.

This method of providing the conductors with well-conducting top layers is not only complicated, but also has the disadvantage that the top layer has a comparatively high electrical resistance. Silicides have an electrical resistance which is many times higher than that of metals usual in semiconductor technology, such as gold, copper, aluminium, and alloys of aluminium with copper and silicon.

SUMMARY OF THE INVENTION

The invention has for its object inter alia to provide a method by which the said disadvantages are counteracted.

According to the invention, the method mentioned in the opening paragraph is for this purpose characterized in that, before the electrode is formed, a surface zone adjoining the surface is formed in the semiconductor body with a depth and a doping such as are desired for the semiconductor zone to be formed below the electrode, after which consecutively the electrode is formed on this surface zone and the portion of the surface zone not covered by the electrode is etched away throughout its entire thickness during the etching treatment.

The well-conducting metals and alloys mentioned above are not capable of withstanding heating to temperatures at which semiconductor zones are formed through diffusion. After the surface zone has been formed in the semiconductor body, this body need not be heated so strongly any more during further steps in the manufacture of the semiconductor device. The said well-conducting metals and alloys, accordingly, can be used in the method according to the invention for achieving that the conductors of the pattern to which the electrode also belongs have a comparatively low electrical resistance.

The pattern of conductors, including the electrode, may be formed by the method according to the invention in a layer which comprises only one of the said well-conducting metals or alloys, but such a layer may also form part of a number of layers deposited one on the other, the conductors being formed in the layer package thus deposited.

Preferably, according to the invention, the surface zone is formed through deposition of a base layer of doped semiconductor material on the surface and through diffusion of dopant into the semiconductor body from this base layer, after which a top layer comprising metal is deposited on the doped base layer and the electrode is formed in the base layer and the top layer. The layer comprising metal, which comprises a well-conducting metal or well-conducting alloy, is deposited on the layer of doped semiconductor material here, which material is in electrical contact with the semiconductor zone. Since the semiconductor zone was formed through diffusion from the layer of doped semiconductor material and since the layer is not removed after the diffusion, this electrical contact has a comparatively low ohmic value.

Preferably, furthermore, the electrode is formed in a package of layers of which the upper layer is a layer of insulating material. In that case, the layer of well-conducting metal or alloy mentioned above or the package mentioned above comprising a layer of polycrystalline silicon and a layer of well-conducting metal or alloy is present in the package below the upper layer of insulating material. After the electrode has been formed in such a layer package, the latter is then provided with an insulation at its upper side. Such an electrode may be provided in a usual, self-aligning manner with insulating edge portions, so that the electrode is entirely surrounded by insulating material. A next layer of conducting material in which a further pattern of conductors is formed may then be laid over the pattern of conductors of which the electrode forms part.

BRIEF DESCRIPTION OF THE DRAWING

The invention will now be explained in more detail with reference to several few embodiments and a drawing, in which.

Figure 1:
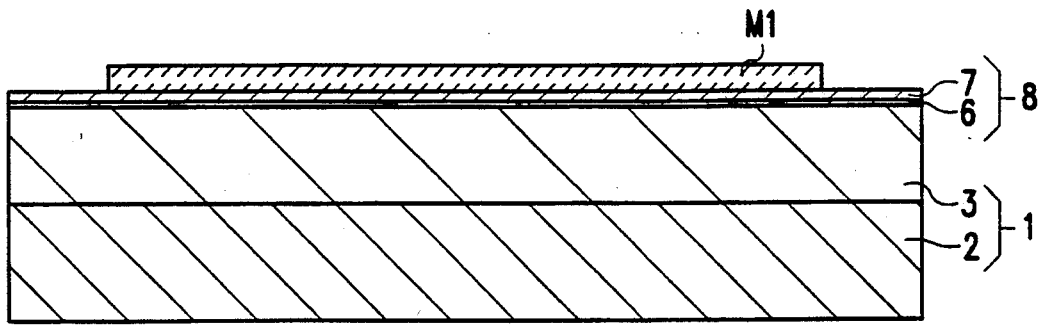
FIGS. 1 to 14 in cross-section show consecutive stages in the manufacture of a discrete bipolar transistor by a first embodiment of the method according to the invention.

The Figures are purely diagrammatic and not drawn to scale. In particular, some dimensions are depicted strongly exaggerated for the sake of clarity. Semiconductor regions of the same conductivity type are hatched in the same direction as much as possible, and corresponding parts have been given the same reference numerals.

DESCRIPTION OF THE PREFERRED EMBODIMENTS

In a first embodiment, the method according to the invention is used for the manufacture of a discrete bipolar transistor with an n-type emitter and collector and an interposed p-type base. Manufacture starts with a semiconductor body 1 of n-type silicon, see FIG. 1. The semiconductor body is doped with arsenic and comprises a comparatively heavily doped substrate 2 with a doping concentration of approximately $8.10^{18}$ and $cm^{-3}$ situated thereon a more weakly doped epitaxial layer 3 with an arsenic concentration of approximately $5.10^{15}$ $cm^{-3}$. The surface 5 of the epitaxial layer 3 is covered consecutively with a comparatively thin silicon oxide layer 6 and a silicon nitride layer 7. Then a photoresist mask M1 is provided on the nitride layer 7 by photolithographic techniques known per se, see FIG. 1.

Figure 2:
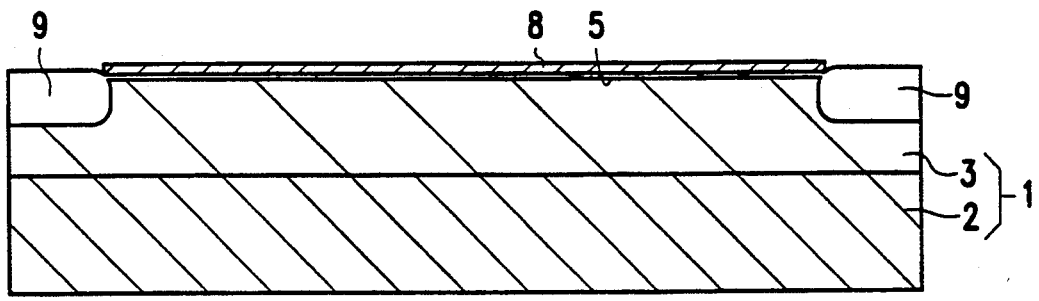

The two layers 6, 7 are etched into a pattern by means of the photoresist mask M1 so as to form an oxidation mask 8, see FIG. 2. After the photoresist mask has been removed, the assembly is exposed to an oxidizing steam environment for approximately four hours. The oxidation mask 8 masks the portions of the semiconductor body 1 covered by it during this, and a pattern 9 of silicon oxide which is partly recessed into the semiconductor body 1 is formed at the surface 5. The oxidation mask 8 is removed afterwards.

Figure 3:
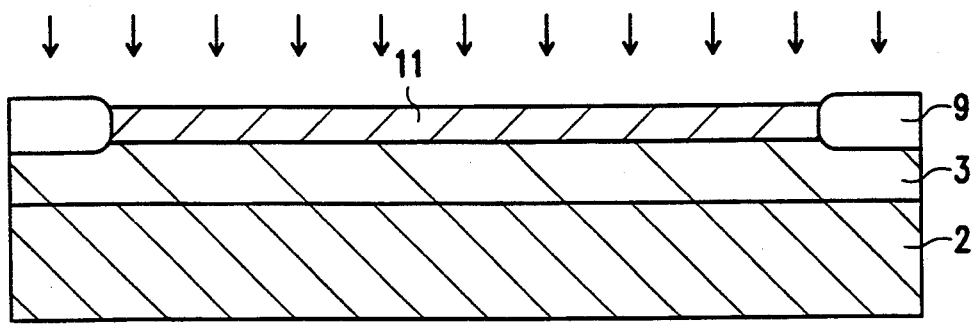

A surface region 11 situated inside the oxide pattern 9 is p-type doped by means of an implantation with boron ions to a total dose of approximately $2.10^-$ $cm^{-2}$, see FIG. 3, after which the implanted dopant is activated in a nitrogen atmosphere at a temperature of approximately 90° C. for approximately thirty minutes. The surface region 11 forms the base of the eventual transistor, while the adjoining portion of the n-type epitaxial layer 3 forms the collector.

After the surface 5 has been thoroughly cleaned, the surface region 11 is covered with a first conductive layer from which a first electrode will be formed in a later stage. It is desirable or even required for many applications that the first electrode to be formed has a comparatively low electric resistance. Often it will only be possible to realise this through the use of a material comprising a metal for the electrode. Many metals, metal compounds and mixtures comprising a metal usual in semiconductor technology, however, have the disadvantage that they do not remain stable at higher temperatures, and in particular at temperatures which are usual in semiconductor technology for forming semiconductor zones. As a result, such materials cannot be used in many semiconductor processes until in a comparatively late stage. Thanks to the present invention, however, such a material can already be used in a comparatively early stage. The invention in particular provides the possibility in the present embodiment of using a material comprising a metal for the first conductive layer already, and thus for the first electrode to be formed therefrom.

In this embodiment, a multiple layer is used for the first conductive layer, comprising a base layer of doped silicon and to layers comprising metal provided thereon: an intermediate layer of titanium-tungsten-nitrogen (TiNW) and a top layer of aluminium. It is especially the top layer which serves to reduce the square resistance of the complete layer to a sufficient degree.

Figure 4:
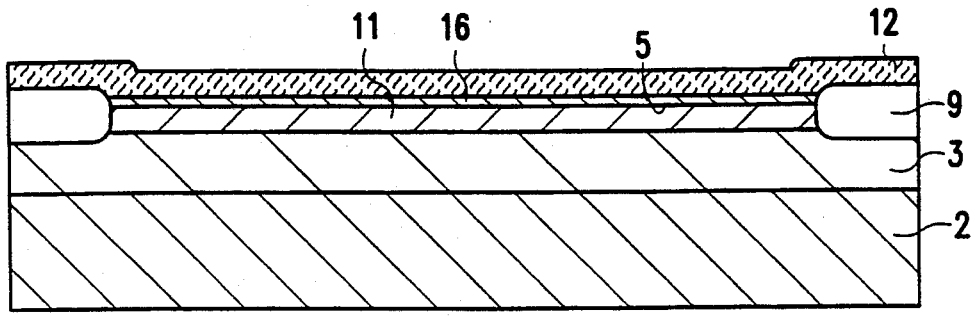

Of the first conductive layer, first the base layer 12 of doped silicon is provided, see FIG. 4. For this purpose, approximately 200 nm silicon is deposited on the surface 5 in polycrystalline form by means of gas-phase deposition (CVD). The silicon layer 12 thus formed is n-type doped with arsenic by means of an ion implantation and brought to the desired doping concentration of approximately $10^{21}$ $cm^{-3}$. In fact, the layer 12 may alternatively be doped during the gas-phase deposition already, and a different n-type impurity may be chosen instead of arsenic, for example, phosphorus.

Figure 5:
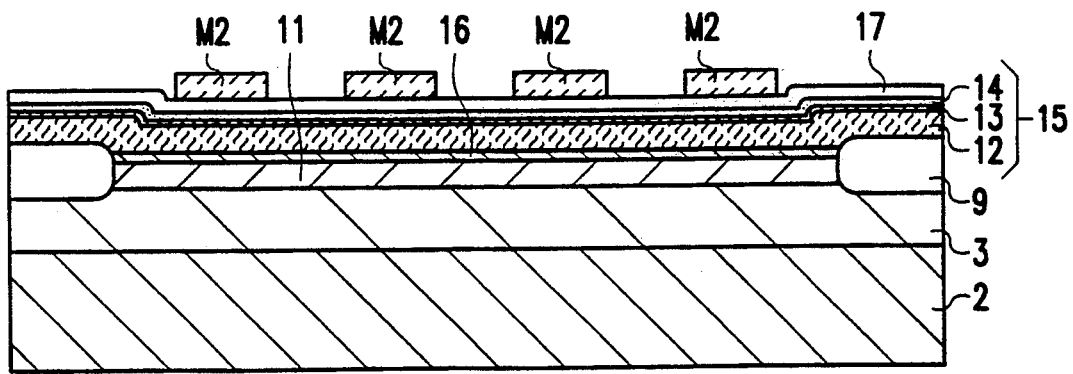

Before the TiW intermediate layer and the aluminium top layer are provided, the assembly is given a heat treatment at approximately 1100° C. for approximately 7 seconds. Arsenic diffuses from the silicon layer 12 into the surface region 11 during this, and an n-type surface zone 16 is formed therein which extends over practically the entire surface region 11, but has a smaller depth. In contrast to silicon, TiNW and aluminium are not resistant to such a high temperature. Aluminium disintegrates fully at such a temperature, while TiNW forms undesirable silicides with the subjacent silicon. According to the invention, therefore, the remaining portion of the first conductive layer 15 is not provided until after the surface zone 16 has been formed and the accompanying heat treatment has been completed, only then is the silicon base layer 12 covered consecutively with an approximately 10 nm thick intermediate layer 13 of titanium-tungsten and an approximately 700 nm thick top layer 14 of aluminium, see FIG. 5.

The resistivity of aluminium is $3.10^{-6}$ $\Omega.cm$, which is much lower than that of doped silicon which is at least of the order of $1.10^{-3}$ $\Omega.cm$ depending on the impurity used and its concentration. The use of the aluminium top layer 14, therefore, considerably increases the conductance of the first conductive layer 15. This may indeed be achieved alternatively with other metal-containing materials instead of with aluminium, for example, with gold, titanium-tungsten, or a silicide of molybdenum, titanium, or platinum. It is true for all these materials usual per se in semiconductor technology that they have a considerably lower resistivity than doped silicon, ranging from $2,5.10^{-6}$ $\Omega$.cm for gold to $30.10^{-6}$ $\Omega$.cm for platinum silicide and molybdenum silicide, but that they are not inert at the temperature of the heat treatment previously carried out, for example, because they disintegrate fully or react with silicon. Thanks to the present invention, the heat treatment at approximately 1100° C. previously carried out is the last process step at such a high temperature, so that the said materials comprising metals may nevertheless be used for the first conductive layer.

After the first conductive layer 15 (12, 13, 14) has been completely provided in this manner, the assembly is covered with an insulating layer 17, in this example made of silicon oxide. For this purpose, approximately 200 nm silicon oxide is provided on the conductive layer 15 (12, 13, 14) at a temperature of approximately 300° C. by means of plasma deposition from a plasma of SiH$_4$ and N$_2$O. This temperature is sufficiently low for preventing the aluminium top layer 14 and the TiNW intermediate layer 15 being attacked. Subsequently, a photoresist mask M2 is provided on the oxide layer through the use of photolithographic techniques known per se, which mask defines the first electrode to be formed from the first conductive layer 15 (12, 13, 14).

Figure 6:
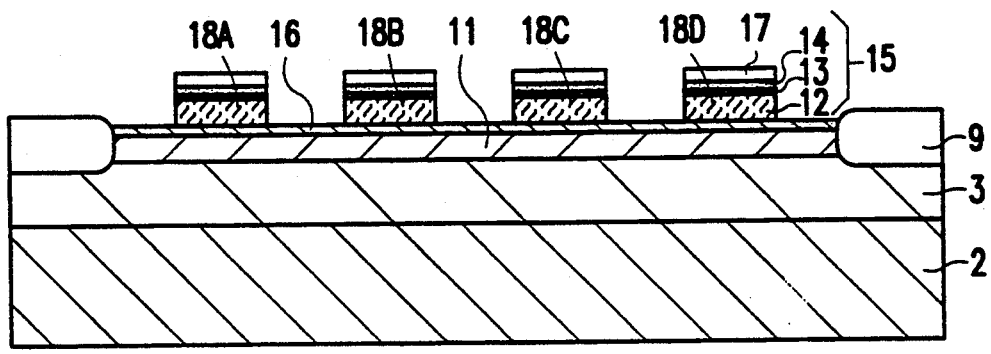

Through this mask, the silicon oxide layer 17, the aluminium layer 14, the titanium-nitrogen-tungsten layer 13 and the silicon layer 12 are etched into a pattern in that order by means of etchants which are usual per se, see FIG. 6. The first electrode thus formed from the first conductive layer 15 (12, 13, 14) serves as the emitter electrode of the transistor to be formed and comprises a number of fingers 18A . . . 18D at the area of the surface region 11 which are in contact with the surface zone 16. The fingers 18A–18D are all defined by the same mask and need not be aligned relative to one another. Their interspacing can therefore be reduced to the minimum dimension which can be imaged. An alignment tolerance need be taken into account in relation to the silicon oxide pattern 9 only. In practice, however, this leads to a comparatively small increase in the chip surface area required for the transistor.

Figure 7:
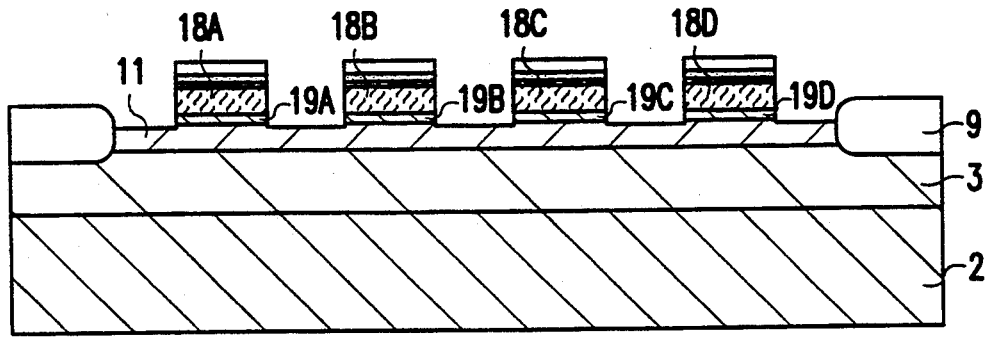

The surface zone 16 is subsequently etched away throughout its thickness with the emitter electrode 18A–18D acting as a mask. Thus a number of parallel, n-type semiconductor zones 19A . . . 19D of monocrystalline silicon, each contacted by a finger 18A . . . 18D of the emitter electrode, are formed from the surface zone 16, together forming the emitter of the transistor. The structure now obtained is depicted in FIG. 7. Since the emitter 19A–19D was etched into a pattern with the emitter electrode 18A–18D as a mask, the emitter is automatically aligned relative to the emitter electrode and does not or substantially not extend outside this electrode. Accordingly, no space is lost for positioning the emitter electrode 18A . . . 18D relative to the emitter 19A . . . 19D.

Figure 8:
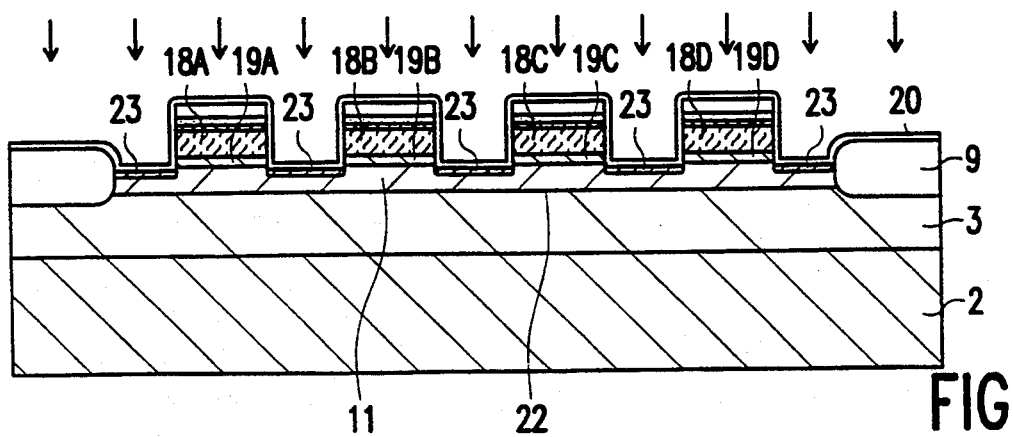

The assembly is now covered with an approximately 50 nm thick silicon oxide layer 20, see FIG. 8. For this purpose, silicon oxide is deposited from a plasma of SiH$_4$ and N$_2$O at a comparatively low temperature of approximately 300° C. The temperature is sufficiently low for the emitter electrode 18A–18D formed previously not to be attacked. Then an implantation with boron ions is carried out with a dose of approximately $1.10^{15}$ cm$^{-2}$ and an energy of approximately 40 keV. The silicon oxide layer 20 protects the otherwise exposed side walls of the emitter fingers 19A–19D from the implantation during this.

Figure 9:
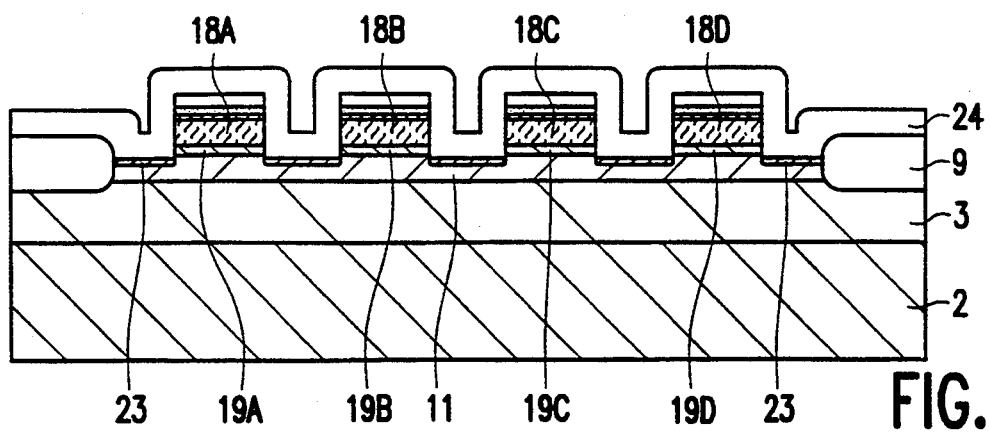
Figure 10:
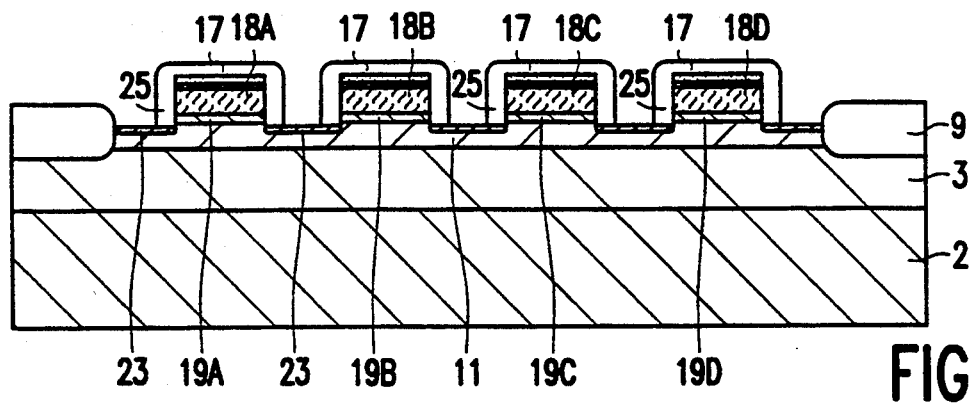

After the dopant for the base connection zone 23 has been provided, the assembly is covered with a comparatively thick silicon oxide layer 24 of approximately 500 nm, see FIG. 9. Again, plasma deposition at a comparatively low temperature of approximately 300° C. is used so as to affect the emitter electrode 18A–18D as little as possible. The silicon oxide layer 24 is subsequently etched back anisotropically in a manner known per se until only a portion 25 thereof situated along the edge of the emitter electrode 18A–18D remains, see FIG. 10. The emitter electrode 18A–18D is thus laterally provided with an insulating edge portion 25. Owing to the initially greater silicon oxide thickness on top of the emitter electrode 18A–18D, the emitter electrode is still covered with a portion of the previously provided silicon oxide layer 7 at the top afterwards, so that the electrode is now entirely surrounded by insulating material.

Figure 11:
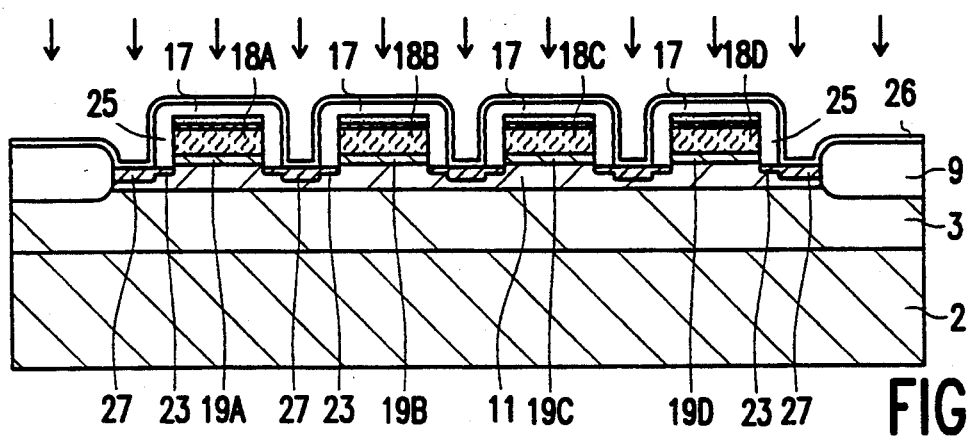

In a manner analogous to the formation of the base connection zone 23, a base contact zone 27 is now formed in the surface area 11, see FIG. 11, but with the difference that here a boron implantation with a higher dose of approximately $2.10^{16}$ cm$^{-2}$ is used. Again, the fingers 18A–18D of the emitter electrode mask against the implantation. In addition, the edge portion 25 also acts as a mask, so that the implanted impurity enters the central portion of the base connection zone 23.

To obtain a satisfactory ohmic connection to an electrode yet to be provided, it is necessary for the doping concentration at the surface of the contact zone to be sufficiently high. On the other hand, the contact zone must not be too deep and especially must not extend down to the pn-junction 22 between the base zone 11 and the collector region 3 because this would lead to an undesirable increase in the base-collector capacitance of the eventual transistor. To comply with both these requirements, the entire assembly is covered with a semi-masking layer 26, formed by an approximately 50 nm thick silicon oxide layer in the present example, before the base contact zone 27 is doped. The doping of the base contact zone 27 is implanted through the semi-masking layer 26 and decelerated therein to such an extent that it penetrates substantially no deeper than to a comparatively small depth of approximately 1000 Å into the surface region 11.

To activate the implanted ions, a comparatively short heat treatment is carried out at a sufficiently low temperature for not attacking the emitter electrode 18 which has now been formed. It is also ensured that the implanted impurity diffuses only a little further and in particular does not reach the pn-junction 22 between the base zone 11 and the collector region 3. A comparatively shallow base contact zone 27 is realised in this way which is more heavily doped than the adjoining portion of the surface region 11 and in which the maximum doping concentration occurs adjacent the surface. The base contact zone 27 and the base connection zone 23 in the eventual transistor together provide a sufficiently low ohmic connection to the interposed active portion of the base zone 11.

Figure 12:
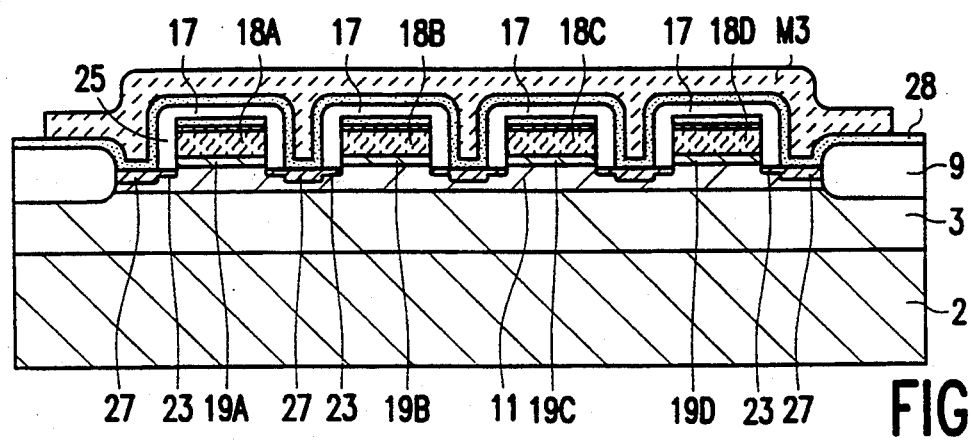
Figure 13:
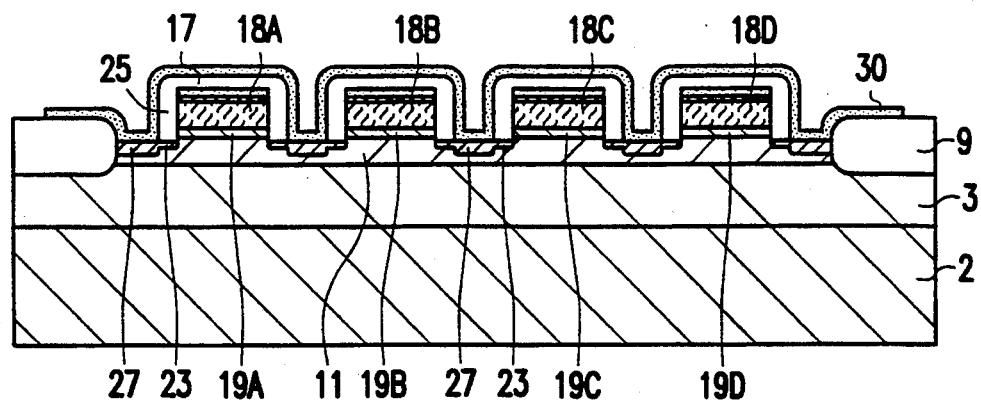

After the semi-masking layer 26 has been removed and the surface 5 has been thoroughly cleaned, a second conductive layer 28 is provided, see FIG. 12. The second conductive layer 28 in this example comprises an approximately 1 $\mu$m thick layer of aluminium. An etching mask M3 is provided on the second conductive layer 28, from which then a second electrode 30 is etched, see FIG. 13, which acts as a base electrode in the present example. The second electrode 30 is provided over the first electrode 18A–18D in this case. Short-circuits between the two electrodes 18A–18D and 30 are avoided by means of the insulating oxide layer 17 on the first electrode and the equally insulating edge portion 25 alongside this electrode, and the second electrode 30 need not be aligned relative to the first electrode 18A–18D. Accordingly, the provision of the etching mask M3 is not very critical.

Figure 15:
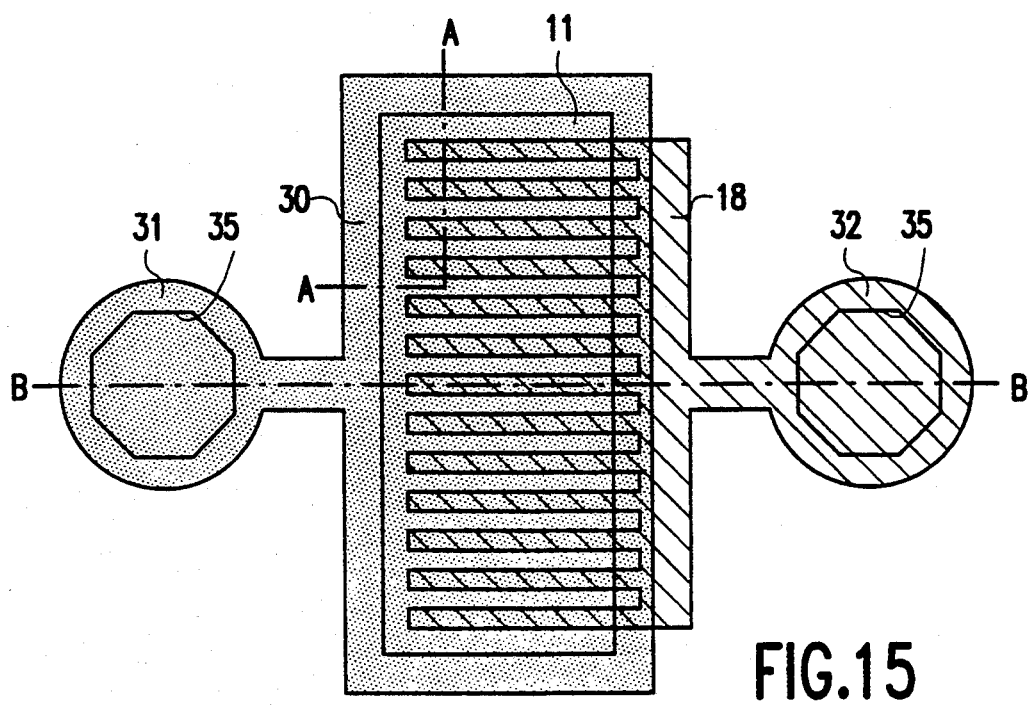
FIG. 15 is a plan view of the transistor in the stage shown in FIG. 13.

The base electrode 30 comprises a bond pad 31 outside the surface region 11, see FIG. 15, on which pad an external connection can be provided. The second conductive layer 28 has been etched away where the emitter electrode 18 comprises such a bond pad 32, and the insulating silicon oxide layer 17 only is present thereon. If it is preferred to connect the base electrode 30 at the surface region 11, on the other hand, such a abase bond pad 31 may be omitted.

Figure 14:
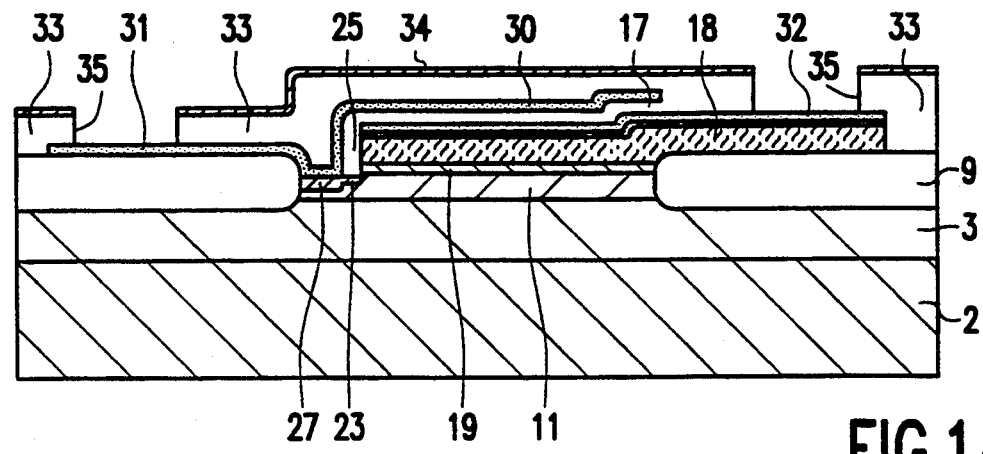

The assembly is then covered with a comparatively thick passivating layer 33 of phosphorus glass and a scratch protection in the form of a comparatively thin layer 34 of silicon nitride in which contact windows 35 are etched by means of a not very critical mask at the areas of the bond pads 31, 32, see FIG. 14. The contact window to the emitter electrode 18 then extends both through the passivating layer 33 and the scratch protection 34 and through the insulating silicon oxide layer 17. The device is then given a final mounting and, if applicable, enveloped.

FIG. 15 shows the structure of FIG. 14 in plan view. The line A—A indicates the cross-sections of FIGS. 1–13. FIG. 14 shows the device in a cross-section taken on the line B—B.

The base 11 of the transistor of FIG. 14 was formed in the semiconductor body by means of a doping treatment. In some cases it is desirable, however, to grow the base separately onto the semiconductor body. In that case a different semiconductor material may be used for the base, if so desired, and very sharp pn-junctions may be realised between the base on the one hand and the collector and emitter on the other hand. The speed and the current gain of the transistor may be improved in this way. According to an alternative modification of the embodiment of the method according to the invention as described above, the transistor of FIG. 14 may be constructed with such a base.

Figure 16:
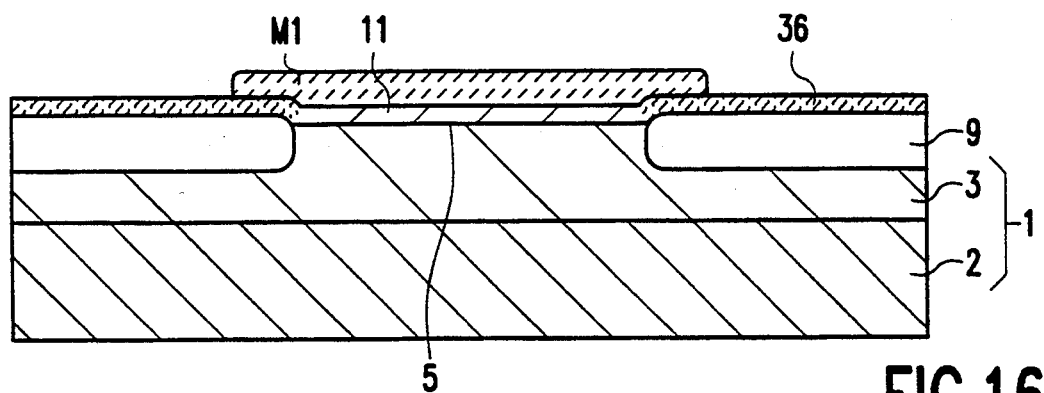
FIGS. 16 to 19 in cross-section show an alternative modification of the first embodiment.

For this purpose, starting from the structure of FIG. 3, a semiconductor layer 36 is deposited on the surface 5 by means of molecular beam epitaxy (MBE) or possibly some other growing technique such as, for example, gas-phase deposition (CVD), see FIG. 16 showing a cross-section corresponding to FIG. 14. The semiconductor layer 36 in this example is approximately 50–100 nm thick and comprises SiGe. During its formation, the layer 36 is p-type doped with boron. The semiconductor layer 36 has a monocrystalline structure where this semiconductor layer 36 is in contact with the epitaxial layer 3. This is not true, however, for the portion lying on the recessed oxide pattern 9; the layer 36 is grown amorphously thereon.

Figure 17:
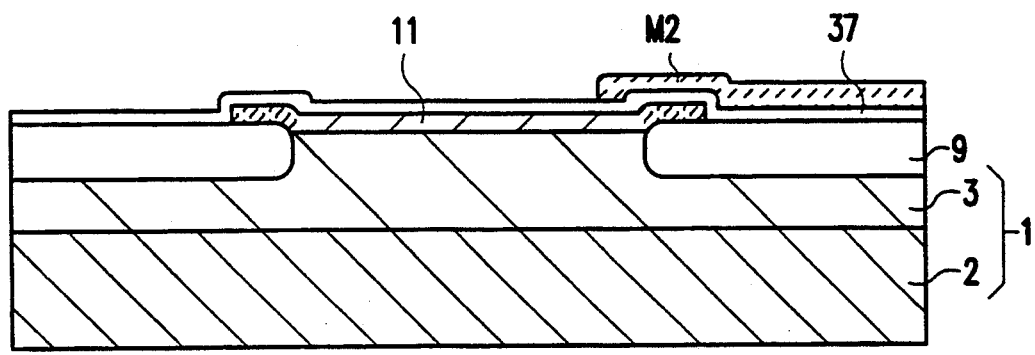

The semiconductor layer 36 is then provided with a low-critical mask M1. A surface region 11 is etched from the semiconductor layer 36 through this mask, see FIG. 17, which region will form the base of the transistor. The surface region 11 lies partly on the oxide pattern 9. This portion does not contribute to the base of the eventual transistor, but forms a parasitic diode if an emitter region is provided thereon. This diode leads to an increase in the emitter-base capacitance and to an increased base current, and thus to a decrease in the gain factor of the transistor. The amorphous structure of this portion of the surface region 11 in addition leads to very disadvantageous electrical properties, so that such a parasitic emitter-base diode also has a strong adverse effect on the transistor characteristics.

Figure 18:
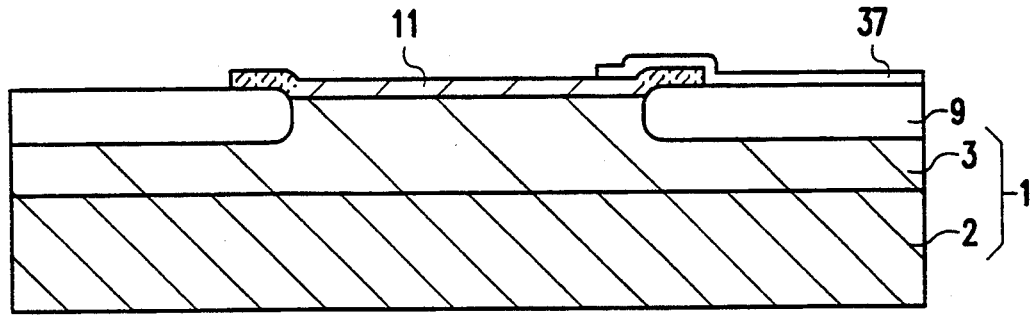

To avoid this, the assembly is covered with an insulating intermediate layer 37, after which an etching mask M2 is provided. A portion covering the amorphous portion of the surface region 11 lying on the oxide pattern 9 is etched from the intermediate layer 27, see FIG. 18. In this example, an approximately 100 nm thick silicon oxide layer is used for the intermediate layer 37. If so desired, a different insulator may be used instead, for example, silicon nitride.

Figure 19:
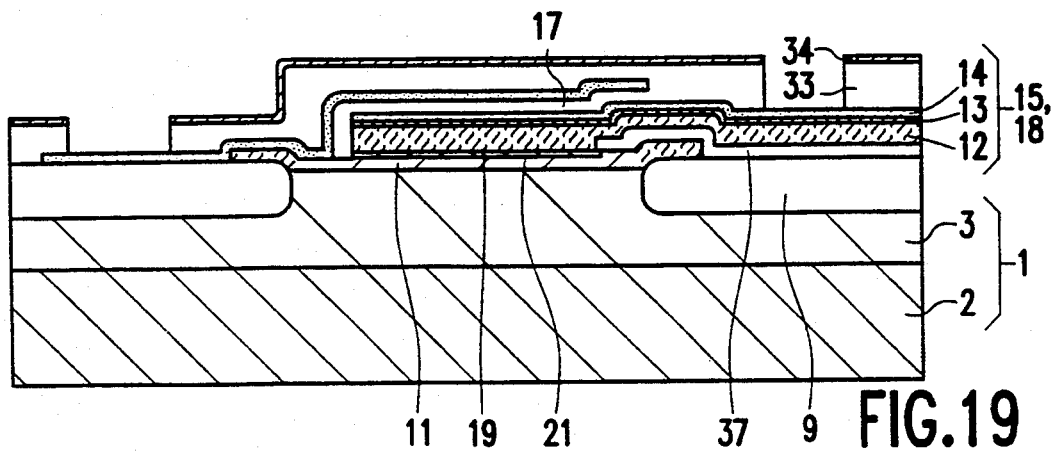

Then the steps of FIG. 4 ff. are followed, so that eventually the structure of FIG. 19 is obtained. The first electrode 18 lies on the epitaxial base 11 with a base layer 12 of polycrystalline silicon, but is separated from the amorphous portion of the base 11 by the insulating intermediate layer 36. A semiconductor zone 19 has been diffused into the base 11 from the base layer 12 of the first electrode 18 only there where the first electrode 18 and the base 11 are in contact with one another. This semiconductor zone 19 forms the emitter of the transistor. The base-emitter junction 21 thus lies entirely in the monocrystalline portion of the base 11, so that the amorphous parasitic emitter-base diode described above is not formed.

A third embodiment of the method according to the invention is used for the manufacture of a discrete vertical junction field effect transistor with a source and drain region which are mutually separated by a channel region in which the conduction can be controlled by means of a gate electrode. The gate electrode comprises a Schottky layer with which the conduction in the channel region can be controlled. Such a transistor is also called Permeable Base Transistor (PBT).

Figure 20:
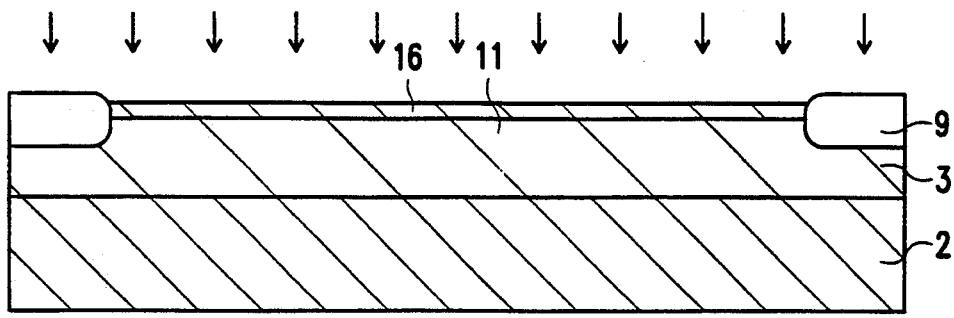
FIGS. 20 to 30 show a third embodiment of the method according to the invention, in which a junction field effect transistor is formed.

Starting from the structure of FIG. 2, and after the oxidation mask has been removed, a comparatively heavily doped n+-type surface zone 16 is formed in a surface region 11 of the n-type epitaxial layer 3 surrounded by the recessed silicon oxide layer 9 by means of an arsenic implantation, see FIG. 20. The arsenic implantation dose is approximately $1.10^{16}$ cm$^{-2}$ and the implantation energy is approximately 40 keV. Alternatively, if so desired, a different n-type impurity such as, for example, phosphorus or antimony and a different doping method may be used. A heat treatment is then carried out for approximately 30 minutes and a temperature of approximately 1000° C. for activating the implanted impurity.

Figure 21:
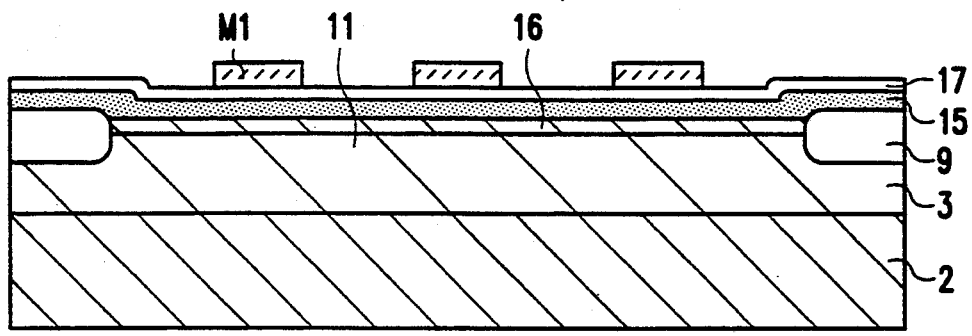
Figure 22:
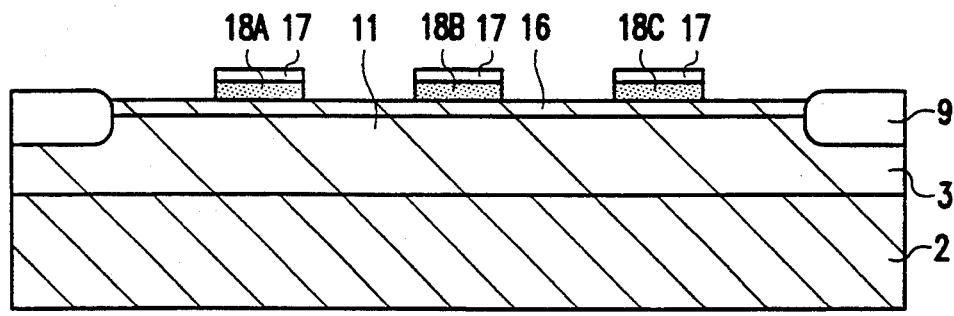

The assembly is then covered with a first conductive layer 15 of aluminium with a thickness of approximately 700 nm, after which an etching mask M1 is provided by photolithographic techniques which are known per se, see FIG. 21. With this mask, a first electrode is etched from the first conductive layer, see FIG. 22, which electrode comprises a number of fingers 18A–18C at the area of the surface region and which acts as the source electrode in the eventual transistor.

Figure 23:
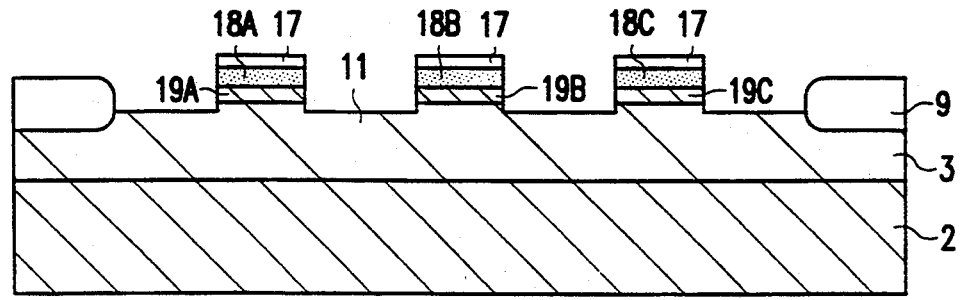

With the first electrode 18A–18C acting as a mask, the exposed portion of the surface zone 16 is etched away throughout its entire thickness, see FIG. 23. A number of semiconductor zones 19A–19C are thus formed from the surface zone 16, each contacted by one of the fingers 18A–18C of the source electrode. The semiconductor zones 19A-19C together form the source zone of the transistor. Thanks to the comparatively high doping level of the source zone 19A-19C, there is a well-conducting ohmic connection between the source electrode 18A-18C on the one hand and the source zone 19A-19C on the other hand.

Figure 24:
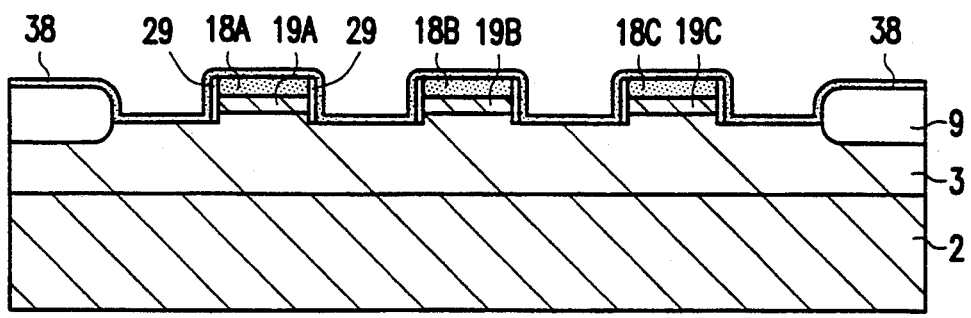
Figure 25:
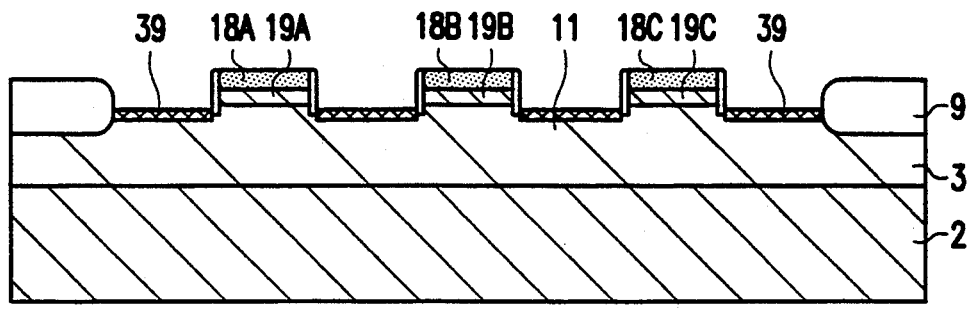

The assembly is now covered with an approximately 100 nm thick protection layer of silicon oxide which is subsequently etched back anisotropically until only an edge portion 29 thereof remains, laterally covering the fingers of the source electrode, see FIG. 24. Then the assembly is entirely covered with an approximately 25 nm thick platinum layer 38, after which a siliciding treatment is carried out at approximately 450° C. This temperature is sufficiently low for not attacking the first electrode 18A-18C already present. Platinum reacts with silicon under formation of a platinum silicide wherever the platinum layer 38 is in contact with silicon. The platinum layer 38 remains intact in the other locations, and the remaining platinum is removed selectively relative to the formed platinum silicide afterwards, see FIG. 25. This is especially relevant for the flanks of the fingers 18A-18C of the source electrode. The edge portion 29 present thereon protects the source electrode during the siliciding treatment.

The top layer 39 of platinum silicide thus formed constitutes a Schottky junction with the subjacent surface region 11 and acts as a gate electrode in the eventual transistor. The edge portion 29 is sufficiently thin for not hampering the gate operation of the gate electrode.

Figure 26:
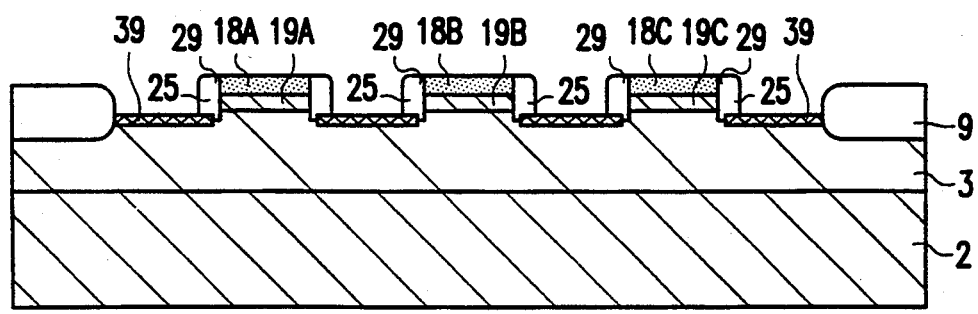

The flanks of the fingers 18A-18C of the source electrode 18 are then provided each with a thicker edge portion of silicon oxide so as to ensure an adequate lateral electrical insulation. For this purpose, the assembly is covered with a comparatively thick layer of approximately 1000 nm silicon oxide by means of plasma deposition, after which the layer is etched anisotropically until only the desired edge portion 25 remains, see FIG. 26.

Figure 27:
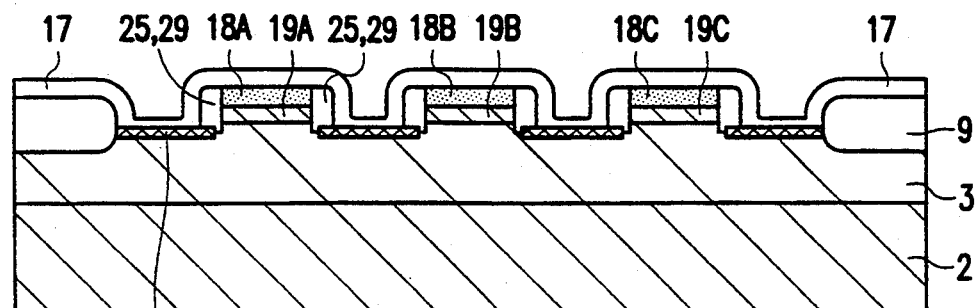
Figure 28:
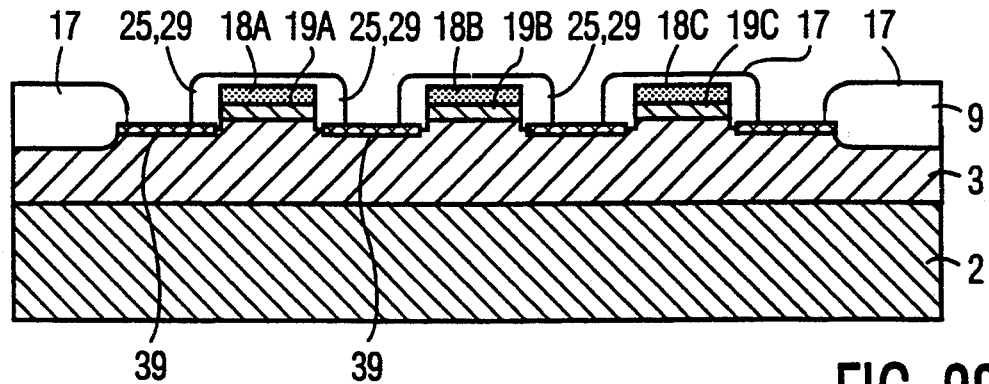

Subsequently, an approximately 1000 nm thick silicon oxide layer is once more deposited from a plasma in order to insulate the source electrode 18A-18C electrically also at the upper side, see FIG. 27. The silicon oxide layer 17 grows considerably more slowly between the fingers 18A-18D than on these fingers owing to the comparatively small interspacing between the individual fingers 18A-18C, which in this example is approximately 1 μm and corresponds to the minimum dimension which can be imaged with the lithography process used. Such a difference in growing rate is found to occur in practice in the case of fingers having an interspacing of less than approximately 2 μm. This results in an oxide layer 17 which is much thicker on the fingers 18A-18C than between them. The thickness ratio between the portion on the electrode fingers 18A-18C and the portion between them is approximately 2:1. The thinner portion of the oxide layer 17 situated between the fingers 18A-18C is then removed by means of an etching treatment, preferably by means of an anisotropic etching treatment, whereby the structure of FIG. 28 is obtained. The fingers of the source electrode 18A-18C are now surrounded by insulating material.

It is noted, by the way, that also the silicon oxide layer from which the edge portion 25 is formed exhibited such a varying thickness. It would be possible in principle to realise both the edge portion 25 and the top covering of the first electrode 18A-18C in one step in that this layer is etched back for a shorter period. Separate process steps for forming the edge portion 25 and the top covering 17 are preferred here, however, because this is less critical and is found to benefit the integrity of the top covering and especially the edge portion. The electrical insulation of the first electrode is better safeguarded thereby.

Figure 29:
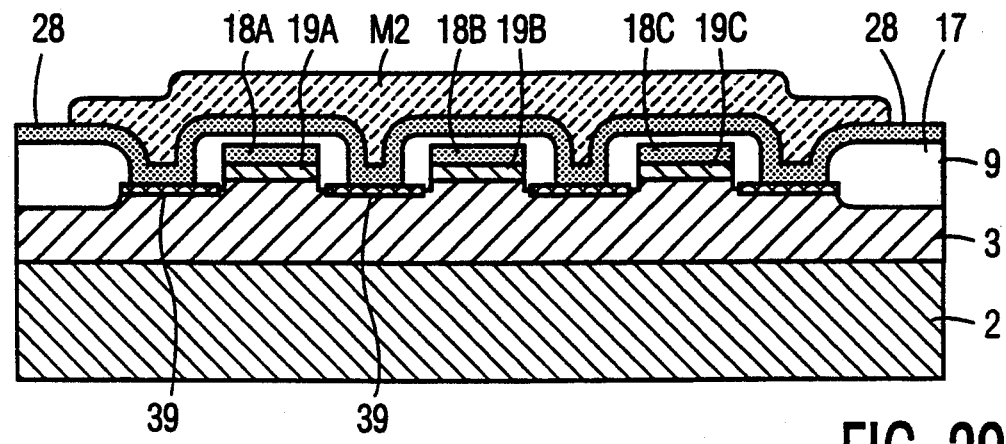
Figure 30:
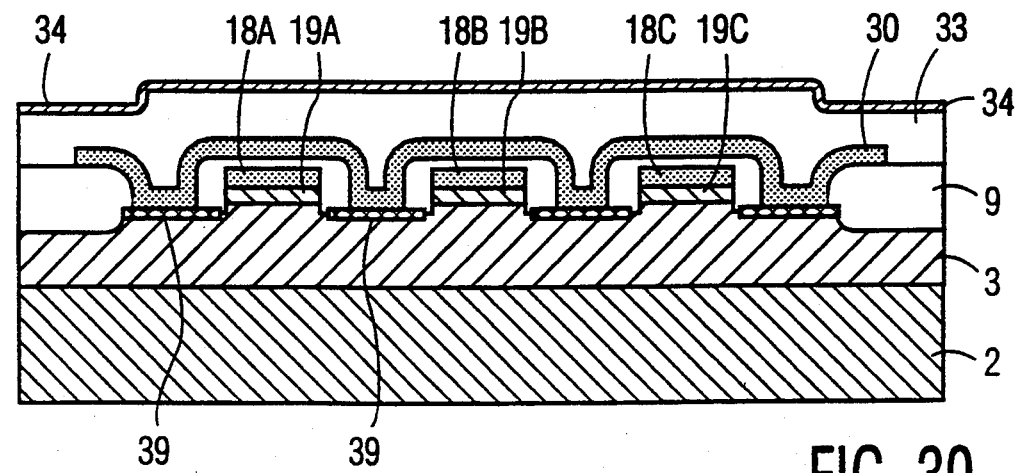

A second electrode is provided for an electrical connection of the gate electrode 39. For this purpose the surface is covered with a second conductive layer 28, in this example an approximately 1 μm thick aluminium layer, see FIG. 29. An etching mask M2 is provided on the second conductive layer 28 by means of photolithographic techniques known per se, by means of which etching mask a second electrode 30 is etched from the second conductive layer 28, see FIG. 30.

Finally, the assembly is covered with a comparatively thick passivating phosphorus glass layer 33, which may or may not be doped with boron, and a scratch protection 34 of silicon nitride in which (outside the plane of the drawing) contact windows are provided to bond pads of the first and second electrodes, which form the source and drain electrodes of the transistor, respectively. The substrate 2 and the epitaxial layer 3 together form the drain zone of the transistor which can be directly contacted by means of a lead frame on which the transistor is finally mounted and enveloped.

In the above embodiments, the invention was used each time for the manufacture of a discrete semiconductor device. The method according to the invention is also suitable, however, for the manufacture of integrated circuits. This is exemplified in the following embodiment with reference to a few Figures. A semiconductor device is here provided with an integrated circuit which comprises both bipolar and MOS transistors. The Figures show a vertical NPN transistor on the left and a PMOS transistor on the right in this circuit each time in consecutive stages of manufacture.

Figure 31:
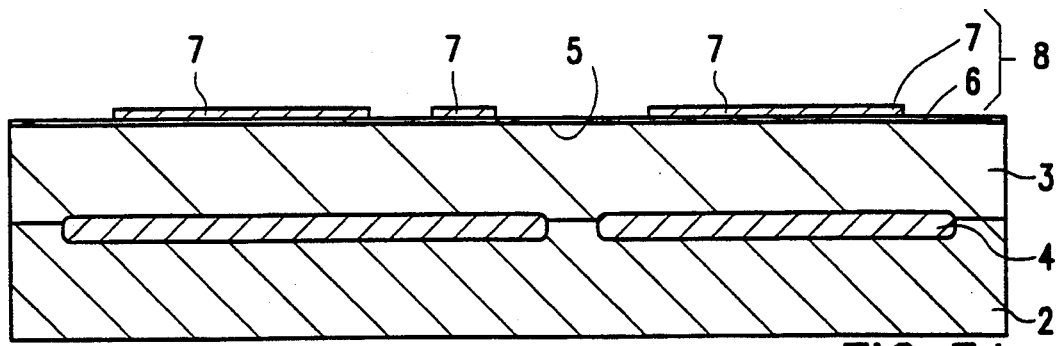
FIGS. 31 to 39 show a fourth embodiment of the method according to the invention whereby an integrated circuit is formed with at least one bipolar transistor and one field effect transistor.

Manufacture starts with a semiconductor body of silicon having a p-type substrate on which an n-type silicon layer is grown epitaxially. Before the silicon layer is grown, the substrate is locally doped at the surface with an impurity so as to form comparatively heavily doped n-type surface zones. The structure of FIG. 31 is obtained in that case after the epitaxial growth, a number of comparatively heavily doped n+-type buried layers 4 being situated at an interface between the p-type substrate 2 and the n-type epitaxial layer 3 which lies thereon. An oxidation mask 8 comprising a top layer of silicon nitride 7 which lies on the semiconductor body 3 with an interposed comparatively thin silicon oxide layer 6 is provided in a manner known per se on the surface 5 of the epitaxial layer 3. Channel stopper zones (not shown) are provided in the unmasked portions of the epitaxial layer 3.

Figure 32:
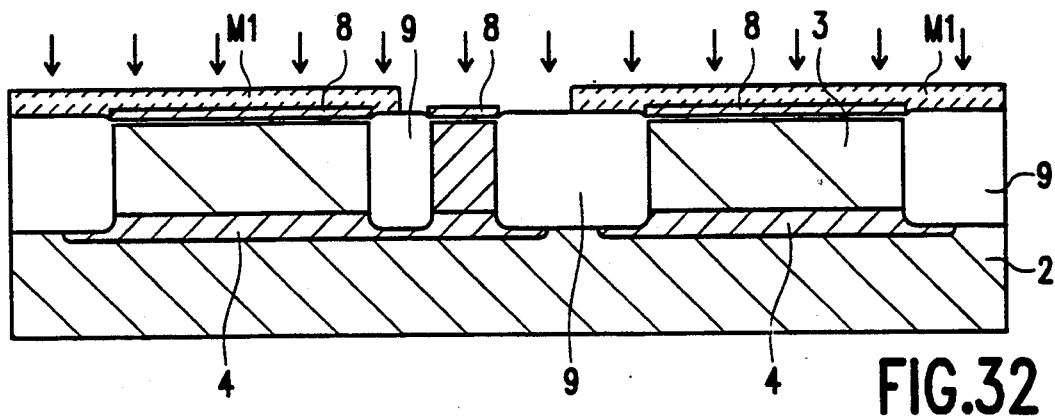

The assembly is now exposed to an oxidizing medium for a prolonged period, during which the oxidation mask 8 protects the subjacent portions of the epitaxial layer 3 from oxidation. This local oxidation of the epitaxial layer 3 (LOCOS) results in a partly recessed oxide pattern 3 which extends throughout the entire thickness of the layer 3, see FIG. 32. The oxide pattern 9 in the final device provides the mutual insulation between the various IC components.

Subsequently, a low-critical implantation mask M1 is provided and a collector contact zone 43 is formed within the oxide pattern 9 by means of an arsenic implantation. A comparatively heavy dose of approximately $1.10^{16}$ cm$^{-2}$ is used for this.

Figure 33:
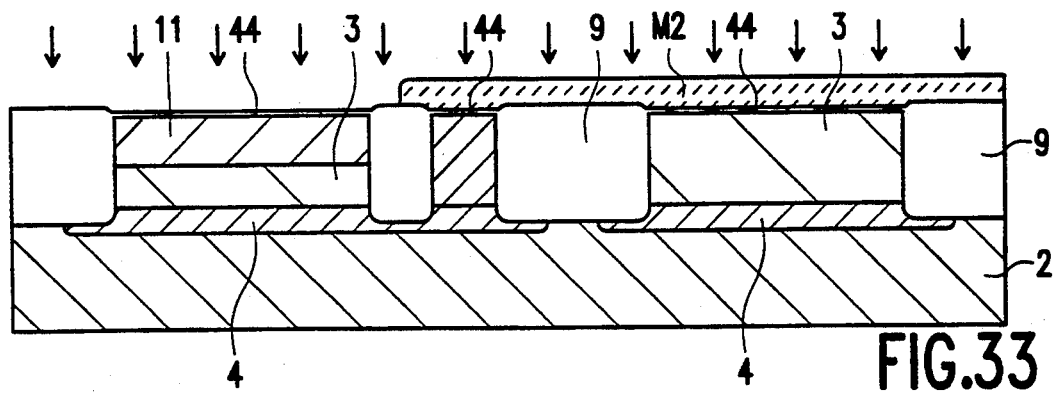

After the surface 5 of the semiconductor body 1 has been thoroughly cleaned, the exposed silicon is oxidized for a comparatively short period so as to form an approximately 20 nm thick silicon oxide layer 44, see FIG. 33. The silicon oxide layer 44 forms a gate dielectric for the MOS transistors in the final device.

A photoresist mask M2 is provided on the silicon oxide layer 44 by means of photolithographic techniques known per se, which mask is used for providing a p-type doping in an exposed surface region 11 of the semiconductor body 2, 3 so as to form a base for the bipolar transistor. For this purpose, an implantation with boron ions is carried out in this case with a dose of approximately $2.10^{13}$ cm$^{-2}$ and an implantation energy of approximately 18 keV.

Figure 34:
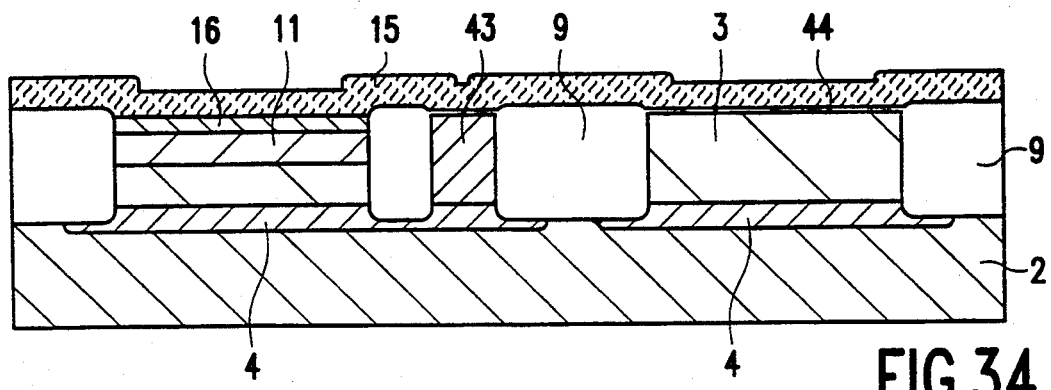

After the implantation, the silicon oxide layer 44 is etched away at the area of the surface region 11 by means of the same mask M2, after which the mask M2 is also removed. After being thoroughly cleaned, the surface is covered with a first conductive layer 15 of polycrystalline or amorphous silicon, see FIG. 34. The silicon layer 15 is comparatively heavily n+-type doped with phosphorus in a dose of approximately $1.10^{16}$ cm$^{-2}$ and serves inter alia as a diffusion source for an n-type surface zone 16 which is formed in the surface region 11 by means of a diffusion step at approximately 1000° C.

Figure 35:
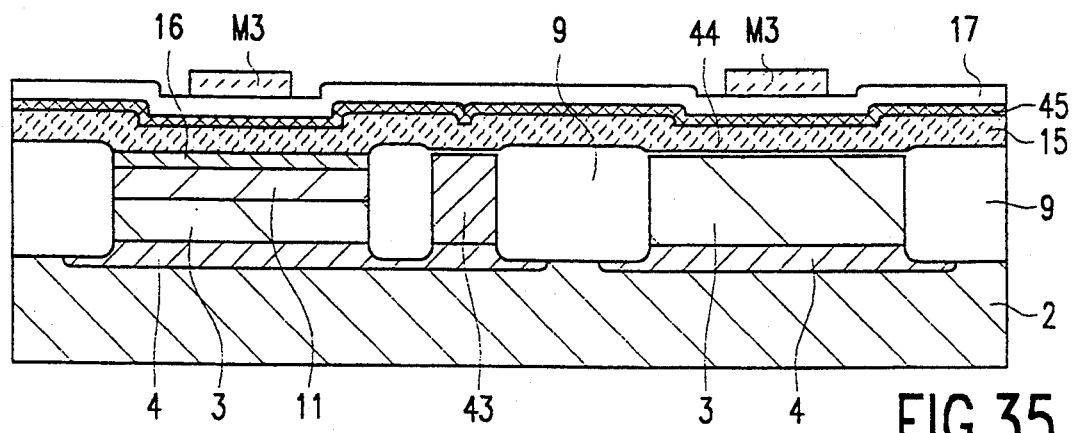

Not until after the formation of the surface zone 16 and the accompanying heat treatment is the silicon layer 15 consecutively covered with an approximately 100 nm thick titanium silicide layer 45 and an approximately 200 nm thick insulating layer 17 of silicon oxide, see FIG. 35. To form the silicide layer 45, the assembly is first covered with a titanium layer, after which the assembly is brought to a temperature of approximately 450° C., and possibly subsequently of 750° C. At this temperature the titanium layer reacts with silicon of the first conductive layer 15 and is converted into titanium silicide throughout its entire thickness. Thus the first conductive layer 15 is provided with a top layer of titanium silicide which is well-conducting compared with doped silicon. The silicon oxide layer 17 is deposited from a plasma of SiH$_4$ and N$_2$O at a comparatively low temperature of approximately 300° C. so as not to attack the titanium silicide layer 45 formed previously. Like many other silicides, titanium silicide is not resistant to comparatively high temperatures, i.e. in the case of titanium silicide to temperatures above 800° C. Exposure of the layer 45 to such high temperatures inevitably has adverse consequences for the square resistance of this layer.

Figure 36:
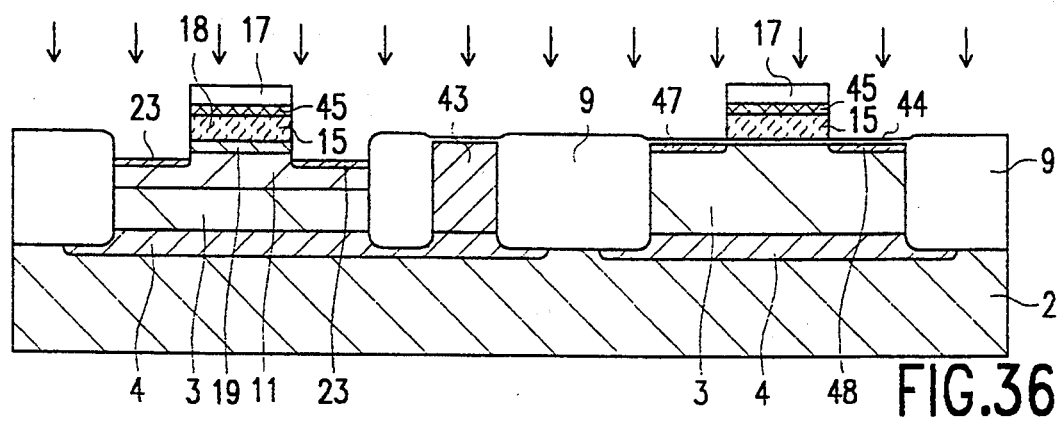

An etching mask M3 is provided on the silicon oxide layer 17, the masking effect being used for etching consecutively the silicon oxide layer 17, the first conductive layer 15, 45, and the surface zone 16 throughout their thicknesses, see FIG. 36. The gate oxide layer 44 protects the subjacent surface region 11 against the final etching step at the area of the PMOS transistor. In this way a first electrode 18 of the bipolar transistor as well as a gate electrode 46 for the PMOS transistor is formed from the first conductive layer 15, 45. The first electrode 18 of the bipolar transistor makes ohmic contact with the subjacent portion 19 of the surface zone 16 forming the emitter and acts as the emitter electrode in the eventual device.

With the formed electrodes 18, 46 and the recessed oxide pattern 9 acting as a mask, a boron implantation is now carried out with a dose of approximately $5.10^{13}$ cm$^{-2}$ and an implantation energy of approximately 25 keV. A comparatively shallow base connection zone 23 is formed thereby at the area of the bipolar transistor. Comparatively shallow and weakly doped portions of the source zone 47 and drain zone 48 are thus provided at the area of the field effect transistor.

Figure 37:
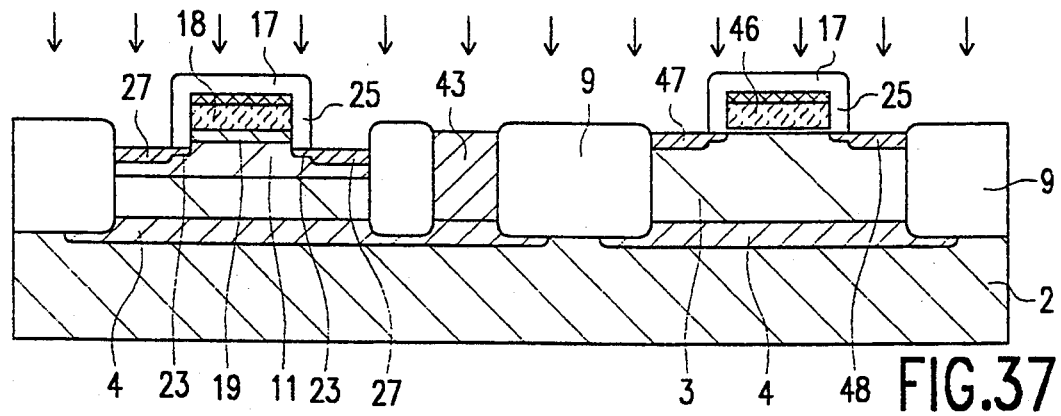

The electrodes 18, 46 are then provided each with an insulating edge portion 25 of silicon oxide, see FIG. 37, after which a further implantation with boron, at least ions comprising boron, is carried out. In the present case a somewhat higher dose of approximately $2.10^{16}$ cm$^{-2}$ is used, while the implantation energy is approximately 17 keV. Thus a comparatively heavily doped base contact zone 27 is formed at the area of the bipolar transistor, and the source and drain zones 47, 48 are each completed with a comparatively heavily doped portion, on which an electrode may be provided, at the area of the field effect transistor. The collector contact zone 43 is so heavily n-type doped that these p-type implantations hardly affect the doping concentration therein.

Figure 38:
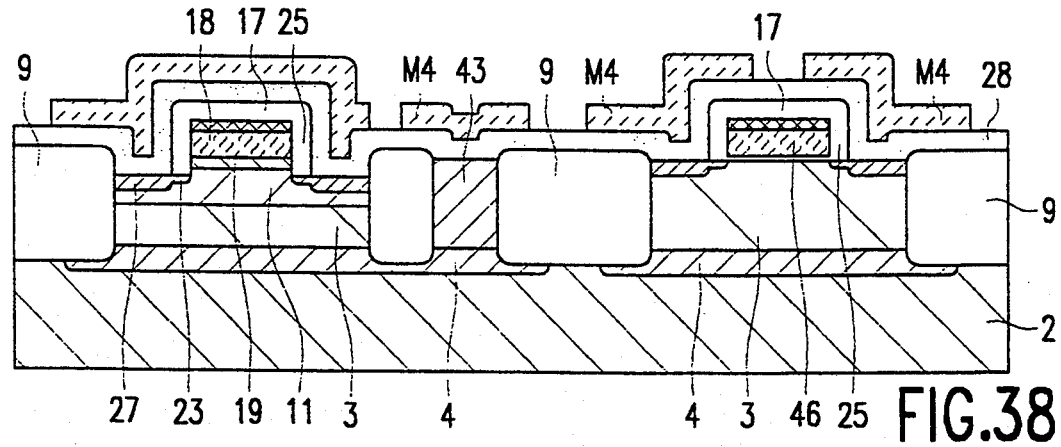
Figure 39:
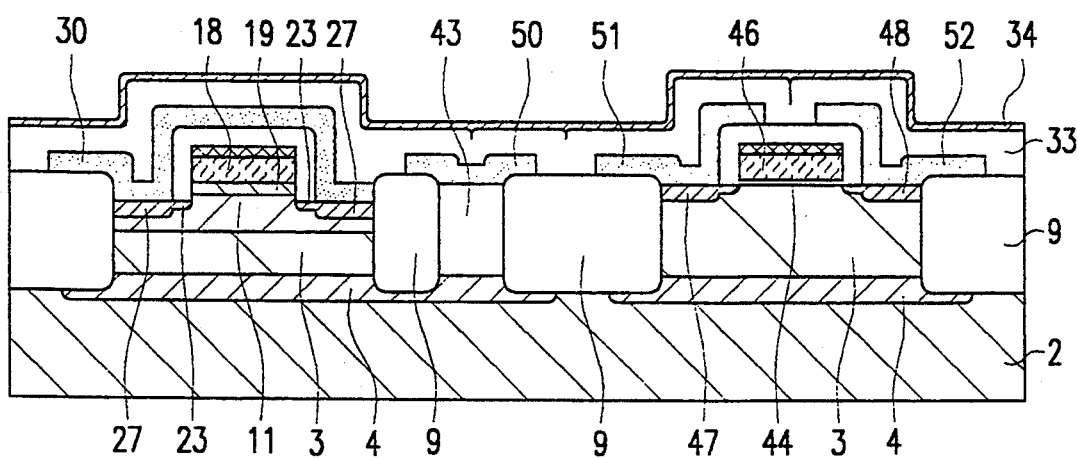

The entire surface is subsequently covered with an approximately 1 µm thick second conductive layer 28 of aluminium on which an etching mask M4 is provided, see FIG. 38. Masked by the etching mask M4, a second electrode 30 for the bipolar transistor is etched from the aluminium layer 28, see FIG. 39, serving as a base connection. In the same etching step, moreover, both a collector electrode 50 for the bipolar transistor and source and drain electrodes 51 and 52, respectively, for the field effect transistor are formed from the aluminium layer 28. In addition, the aluminium layer 28 is locally removed from the emitter electrode 18 and the gate electrode 46 during this etching step (outside the plane of the drawing). The assembly is finally covered with a passivating layer 33 of phosphorus glass, which may or may not be doped, and a scratch protection 34 of silicon nitride in which contact windows are provided for the various electrodes 18, 30, 46, 50–52 (outside the plane of the drawing). The device is now given a final mounting and, possibly, enveloped.

Although the invention was described above with reference to several embodiments, it will be apparent that the invention is by no means limited to the examples given. Many more variations are possible to those skilled in the art within the scope of the invention. Thus the said conductivity types may all (simultaneously) be replaced by the opposite conductivity types and different materials from those mentioned may be used.

In accordance with the invention, in principle any metal and any metal compound may be used for the first conductive layer, so that the use of the invention is by no means limited to aluminium, silicon and/or titanium silicide. Similarly, a different conductor than aluminium may be used for the second conductive layer, for example, gold.

It is also possible to surround the first electrode with insulation in different manners or with different materials. Thus, instead of silicon oxide, for example, silicon nitride may alternatively be used as an insulator. Furthermore, the first electrode may alternatively be insulated, for example, through selective oxidation instead of through deposition. If the electrode is made of aluminium, an oxidizing environment of ammonium pentaborate (NH$_4$B$_5$O$_8$), for example, may be used for this purpose, in which environment aluminium oxidizes considerably more quickly than exposed silicon.

In general, the invention offers a method of manufacturing a semiconductor device whereby no or at least fewer concessions need be made as regards the materials which are used for the required connection conductors and whereby a very compact structure can be obtained.

We claim:

1. A method of manufacturing a semiconductor device with a semiconductor element which comprises a semiconductor zone which is situated below an electrode, adjoins a surface of a semiconductor body, and substantially does not extend laterally outside the electrode, in which method an electrode is formed on the surface of the semiconductor body, after which semiconductor material adjoining the surface and not covered by the electrode is removed by an etching treatment, whereby the position of the semiconductor zone below the electrode is defined, characterized in that, before the electrode (18) is formed, a surface zone (16) adjoining the surface (5) is formed in the semiconductor body (1) through deposition of a base layer (12) of doped semiconductor material on the surface (5) and through diffusion of dopant into the semiconductor body (1) from this base layer (12), with a depth and a doping as desired for the semiconductor zone (19) to be formed below the electrode (18), after which a top layer (13, 14) comprising metal is deposited on the doped base layer (12) and the electrode (18) is formed in the base layer (12) and the top layer (13, 14), and the portion of the surface zone (16) not covered by the electrode (18) is then etched away throughout its entire thickness during the etching treatment.

2. A method as claimed in claim 1, characterized in that a base layer (12) of doped polycrystalline silicon is deposited on the surface (5) and in that a top layer (13, 14) comprising metal is deposited on this base layer, which top layer consists of a barrier layer (13) of TiW and a layer (14) of aluminium.

3. A method as claimed in claim 1, characterized in that the electrode (18) is formed in a package of layers (12, 13, 14, 17) of which the upper layer (17) is a layer of insulating material.

4. A method as claimed in claim 3, characterized in that the electrode is formed in a layer package whose upper layer (17) is made of silicon oxide.

5. A method as claimed in claim 3, characterized in that an electrode (18) is formed in the package of layers (12, 13, 14, 17), which electrode at the area of the surface region (16) comprises a number of substantially parallel strip-shaped portions (18A, 18B, 18C . . .) which are arranged with mutual interspacings of less than 2 $\mu$m, after which a layer of insulating material is deposited over the strip-shaped portions and is subsequently subjected to an anisotropic etching treatment until said layer has been removed from the upper layer of the electrode (18) and insulating edge portions have been formed on the lateral faces of the strip-shaped portions.

* * * * *